United States Patent [19]

Okamoto et al.

[11] Patent Number: 4,480,209
[45] Date of Patent: Oct. 30, 1984

[54] SURFACE ACOUSTIC WAVE DEVICE HAVING A SPECIFIED CRYSTALLINE ORIENTATION

[75] Inventors: Takeshi Okamoto; Ryuichi Asai; Shoichi Minagawa, all of Tokyo, Japan

[73] Assignee: Clarion Co., Ltd., Tokyo, Japan

[21] Appl. No.: 433,483

[22] Filed: Oct. 8, 1982

[30] Foreign Application Priority Data

Oct. 9, 1981 [JP] Japan .................................. 56-160062
Oct. 12, 1981 [JP] Japan .................................. 56-163148

[51] Int. Cl.³ ......................... H01L 27/20; H03H 9/42
[52] U.S. Cl. .................................. 310/313 B; 333/154
[58] Field of Search ........... 310/313 R, 313 A, 313 B, 310/313 D; 333/150, 151, 152, 153, 154, 155, 196

[56] References Cited

U.S. PATENT DOCUMENTS 3,689,784 9/1972 de Klerk .......................... 310/313 B
3,862,431 1/1975 Quate et al. ...................... 310/313 A
4,037,176 7/1977 Ono et al. ........................ 310/313 B

OTHER PUBLICATIONS

Mattioco, et al., "PVF$_2$ Transducers for Rayleigh Waves" *Electronics Letters*, (Mar. 27, 1980) vol. 16, No. 7, pp. 250–251.

*Primary Examiner*—J. D. Miller
*Assistant Examiner*—D. L. Rebsch
*Attorney, Agent, or Firm*—Flynn, Thiel, Boutell & Tanis

[57] ABSTRACT

A surface acoustic wave device includes a silicon substrate having a main surface with a given crystalline orientation, a zinc oxide layer deposited on the main surface of the silicon substrate and a dielectric layer as well as electrodes both formed in contact with said zinc oxide layer, so that a surface acoustic wave will be propagated along a given crystalline axis direction of the silicon substrate.

8 Claims, 11 Drawing Figures

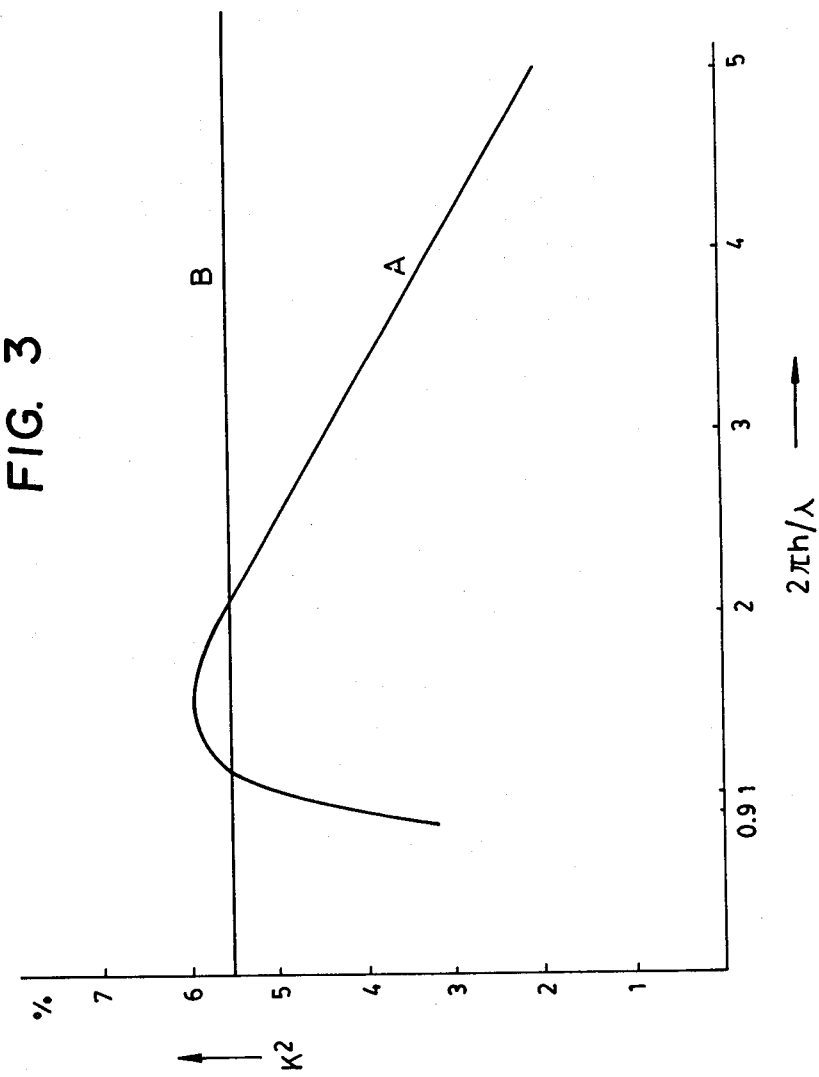

SURFACE ACOUSTIC WAVE DEVICE HAVING A SPECIFIED CRYSTALLINE ORIENTATION

FIELD OF THE INVENTION

This invention relates to a surface acoustic wave device and, more particularly, to such a device having a high frequency and a small temperature coefficient.

BACKGROUND OF THE INVENTION

Today, various surface acoustic wave devices utilizing surface acoustic waves which propagate along a surface of an elastic material are under development.

There are known, as materials for a piezoelectric substrate for surface acoustic wave devices, piezoelectric single crystals such as lithium niobate ($LiNbO_3$), piezoelectric ceramic such as lead zirconate titanate (PZT) or a combination of a non-piezoelectric substrate and a piezoelectric layer such as zinc oxide (ZnO). Among those, lithium niobate has the advantages that its electromechanical coupling factor K is large and that propagation loss of a surface wave is small but has a disadvantage that its temperature coefficient is large. Piezoelectric ceramic has an advantage that its electromechanical coupling factor K is large but has a disadvantage that the propagation loss of a surface wave increases as its frequency becomes high, because it is a sintered material. Further, since said piezoelectric single crystal and piezoelectric ceramic have their own specific functions, respectively, they may be used only in rather limited ways and are not suitable for combination with integrated circuit technology to make devices with desired functions.

On the other hand, when said piezoelectric layer is used, the element is composed, as shown in FIG. 1, of a zinc oxide layer 2, for example, deposited on a non-piezoelectric substrate such as a silicon substrate 1, and electrodes 3 and 4 provided on the zinc oxide layer 2. This permits selected semiconductive elements to be formed on the silicon substrate 1, leading to realization of devices with desired functions.

However, surface-acoustic-wave element including such a piezoelectric layer has a disadvantage that its electromechanical coupling factor is smaller than said piezoelectric single crystal and piezoelectric ceramic, causing inefficiency of its function. Further, it has another disadvantage in that its temperature coefficient is rather large, which make it unsuitable for use in devices in which signal the delay time a is an important factor.

OBJECT OF THE INVENTION

It is therefore an object of the present invention to overcome the above-mentioned problems in the prior art by providing a surface acoustic wave element composed of a zinc oxide layer deposited on one surface of a silicon substrate as cut with a given crystalline orientation and a dielectric layer, as well as electrodes both provided in contact with the zinc oxide layer.

SUMMARY OF THE INVENTION

In accordance with the present invention, there is provided a surface acoustic wave element which comprises:

a silicon substrate having a main surface with a given crystalline orientation;

a zinc oxide layer and a dielectric layer both deposited on said main surface of the silicon substrate;

electrodes formed on said zinc oxide layer; and said electrodes being excited so as to cause a surface acoustic wave to propagate along a given crystalline axis of said silicon substrate.

BRIEF DESCRIPTION OF THE DRAWINGS

FIGS. 3 and 5 are graphs which show characteristics obtained by the present invention;

DETAILED DESCRIPTION OF THE PREFERRED EMBODIMENTS

The present invention will now be described in detail with reference to the drawings.

Figure 1:
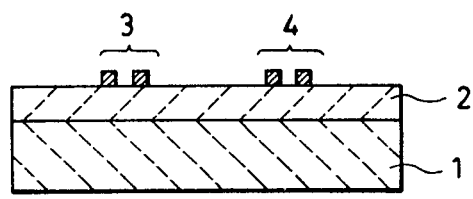
FIG. 1 is a diagrammatic sectional view showing a SAW element in the prior art.
Figure 2:
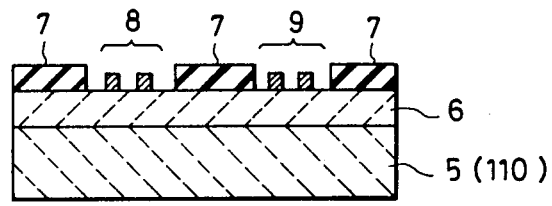
FIGS. 2, 4, 6 and 7 are diagrammatic sectional views illustrating respective embodiments of a SAW device according to the present invention.

FIG. 2 is a sectional view of an embodiment of the surface acoustic wave element according to the present invention. The reference numeral 5 designates a silicon substrate cut to have a (110)-oriented main surface and 6 is a zinc oxide layer so formed on the silicon substrate 5 that the piezoelectric axis of the former is perpendicular to the main surface of the latter. Numeral 7 refers to a dielectric layer made of silicon dioxide, for example, and partially deposited on the zinc oxide layer 6, and 8 and 9 refer to comb-shaped input and output electrodes, respectively, formed on the zinc oxide layer 6 where the dielectric layer 7 does not exist.

The zinc oxide layer 6 and the dielectric layer 7 may be formed by known sputtering or chemical vapour deposition (CVD) and the comb-shaped electrodes 8 and 9 may be formed by depositing aluminum atoms by known vapor deposition.

The input electrode 8 is excited so as to generate a Sezawa wave as a surface acoustic wave propagating in the [001]-axis direction of the silicon substrate 5. Then, the surface acoustic wave propagates along the surface of the zinc oxide layer 6 and reaches the output electrodes 9.

FIG. 3 shows a characteristic curve for the surface acoustic wave element of FIG. 2. The abscissa represents the normalized thickness $2\pi h/\lambda$ of the thickness h of the zinc oxide layer 6 (where $\lambda$ is wavelength of the surface acoustic wave), while the ordinate represents square value $K^2$ of electromechanical coupling factor K in percentage. When conductivity near the boundary between the silicon substrate 5 and the zinc oxide layer 6 is high in the embodiment of FIG. 2, the square value $K^2$ of the electromechanical coupling factor K varies as shown in FIG. 3 with the curved line A. It should be noted that the curve A is a characteristic curve obtained for a Sezawa waves.

The straight line B is the maximum value of $K^2$ when the substrate is made of lithium niobate and represents about 5.5%.

As apparent from the characteristics of FIG. 3, when the surface acoustic wave is made to propagate in the [001]-axis direction of the silicon substrate 5, an electromechanical coupling factor large enough to effectively actuate the element can be obtained by selecting the thickness h of the zinc oxide layer 6 to satisfy the relation $0.9 < 2\pi h/\lambda < 3.0$.

Figure 4:
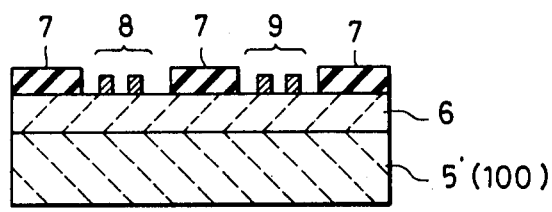

FIG. 4 is a sectional view of another embodiment of the surface acoustic wave element according to the present invention. The reference numeral 5' designates a silicon substrate as cut with a (100)-oriented surface. The other parts which are the same as in FIG. 2 are denoted by the same reference numerals.

The input electrode 8 is excited so as to generate a a Sezawa wave as a surface acoustic wave for propagating in the [110]-axis direction of the silicon substrate 5'.

Figure 5:
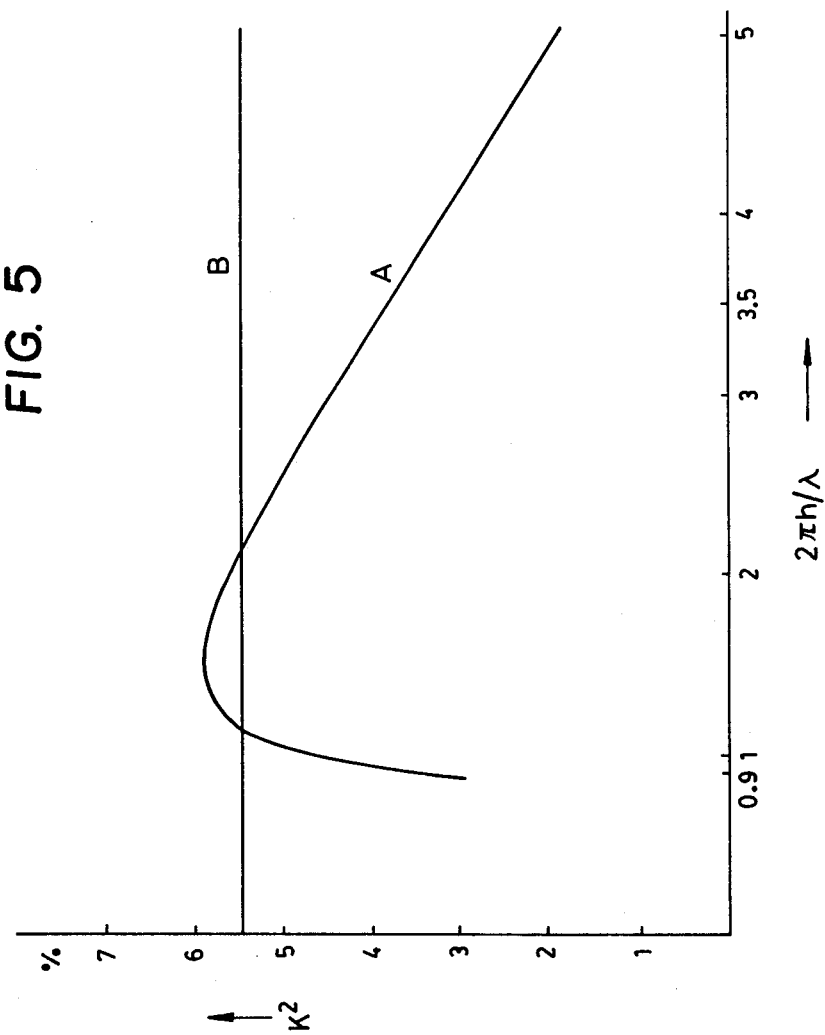

FIG. 5 shows a characteristic curve for the surface acoustic wave element of FIG. 4. When conductivity near the boundary between the silicon substrate 5' and the zinc oxide layer 6 is high, square value $K^2$ of electromechanical coupling factor K varies as shown in FIG. 5 with the curved line A. It should be noted that the curved line A is a characteristic curve obtained for a Sezawa waves.

The straight line B is the maximum value of $K^2$ when the substrate is made of lithium niobate and represents 5.5% approximately.

As apparent from the characteristic of FIG. 5, when the surface acoustic wave is made to propagate in the [001]-axis direction of the silicon substrate 5', an coupling factor large enough to effectively actuate the element can be obtained by selecting the thickness h of the zinc oxide layer 6 to satisfy $0.9 < 2\pi h/\lambda < 3.5$.

Figure 6:
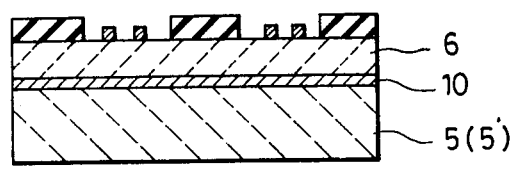

The fact that conductivity near the boundary between the silicon substrate 5 and the zinc oxide layer 6 is high, as described above, means that the same effect is obtained also when a metallic layer 10 is formed at the boundary as shown in FIG. 6.

Further, also when the silicon substrate 5 has an epitaxial growth layer, the same effect as given by the structure of FIG. 2 can be obtained because bulk resistance can be decreased.

Figure 7:
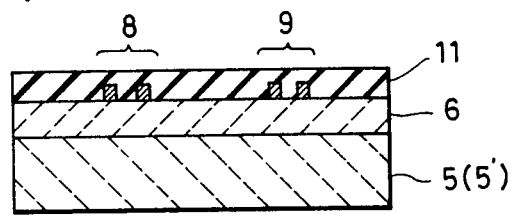

FIG. 7 shows a further embodiment according to the present invention. A dielectric layer 11 made of silicon dioxide, for example, and much thinner than a wavelength of the surface acoustic wave is evenly deposited across an entire surface of the zinc oxide layer and covers the comb-shaped electrodes. This structure also provides the same effect as the embodiments of FIGS. 2 and 4.

FIGS. 8 to 11 show still further embodiments according to the present invention, respectively.

Figure 8:
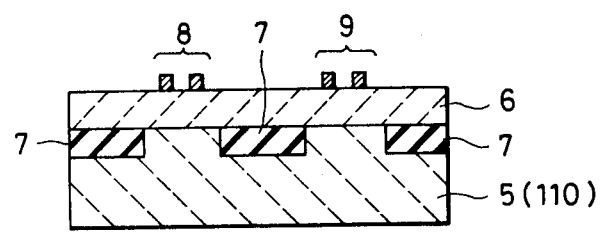
FIGS. 8 to 11 are diagrammatic sectional views which respectively show four further embodiments of the SAW device according to the present invention.

In the embodiment of FIG. 8, the dielectric layer 7 is partially formed on the silicon substrate 5 which has a (110)-oriented main surface, the zinc oxide layer is deposited on the main surface of the silicon substrate 5 and the dielectric layer 7, and the input and output electrodes 8 and 9 are formed on the zinc oxide layer 6.

Figure 9:
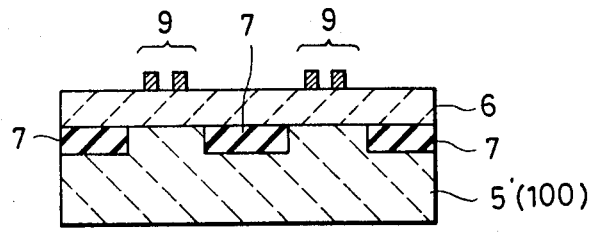

In the embodiment of FIG. 9, the silicon substrate 5' has a (100)-oriented main surface. The other parts are same as those in FIG. 8.

Figure 10:
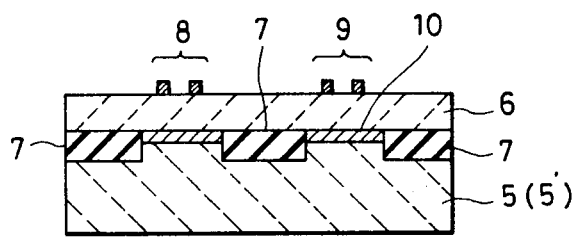

FIG. 10 shows a surface acoustic wave element including the metallic layer 10 provided between the silicon substrate 5 (5') and the zinc oxide layer 6 of FIG. 8 or FIG. 9.

Figure 11:
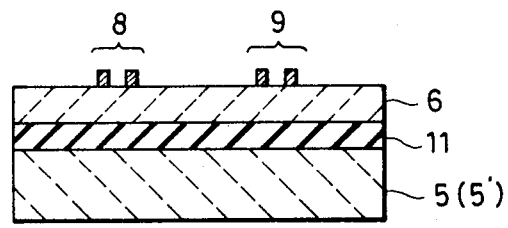

In the embodiment of FIG. 11, the dielectric layer 11 is evenly deposited throughout the main surface of the silicon substrate 5 (5').

With those arrangements, the silicon dioxide which makes the dielectric layer 7 reduces the temperature coefficient of the element which is determined by the silicon substrate 5 and the zinc oxide layer 6. This means that the temperature coefficient of the element is made rather small as a whole.

The comb-shaped electrodes may be formed on the silicon substrate. Also, the metallic layer may be deposited on the zinc oxide layer which is opposed to the comb-shaped electrodes.

In the embodiments discussed above, the zinc oxide layer is so formed that the piezoelectric axis thereof is perpendicular to the main surface of the silicon substrate 5. However, also when the piezoelectric axis is inclined so as to be within approximately 10 degrees of said perpendicular line, substantially the same characteristic can be obtained. Also when the main surface of the silicon substrate 5 and the propagation axis for the surface acoustic wave are deviated within several degrees from the (110)-surface or (100)-surface and the [001]-axis or [011]-axis, respectively, substantially the same characteristic was obtained.

As apparent from the description above, the surface acoustic wave element according to the present invention is composed of a silicon substrate which is cut with a given crystalline surface, a zinc oxide layer deposited on the silicon substrate and a dielectric layer and electrodes both provided on the zinc oxide layer. Therefore, the electromechanical coupling factor is made flexible and can be determined at a desired value. Further, the temperature coefficient can be made smaller by providing a dielectric layer.

Since the electromechanical coupling factor can be enlarged, impedance of the surface acoustic wave transducer may be made small, thereby permitting easier matching. This leads to realization of a surface acoustic wave element operable with a high efficiency.

At the same time, since it is possible to reduce the number of electrodes of the surface acoustic wave transducer, the element can be made more compact and manufactured at a lower cost.

A small temperature coefficient ensures reliable operation of the surface acoustic wave element.

When using a Sezawa wave as the surface acoustic wave, a large phase velocity of the Sezawa wave is advantageous in realization of an element particularly suitable for high frequency.

If an IC substrate is commonly used as said silicon substrate, it is possible to obtain a device which is compact, highly integrated and has desired functions. Said device will be effective in many uses.

The embodiments of the invention in which an exclusive property or privilege is claimed are defined as follows:

1. A surface acoustic wave device, comprising a silicon substrate having a main surface which has a predetermined crystalline orientation and has first and second portions; a layer of a dielectric provided on said first portion of said main surface of said substrate; a layer of zinc oxide provided on said dielectric layer and on said second portion of said main surface of said silicon substrate; and plural electrodes provided on said zinc oxide layer, electrical excitation of said electrodes causing a surface acoustic wave to propagate along a predetermined crystalline axis of said silicon substrate.

2. The surface acoustic wave of claim 1, including means defining a metallic layer between said zinc oxide layer and said second portion of said main surface of said silicon substrate.

3. The surface acoustic wave device of claim 1, wherein said main surface of said substrate has a (110) crystalline orientation.

4. The surface acoustic wave device of claim 1, wherein said predetermined crystalline axis of said silicon substrate is (001).

5. The surface acoustic wave device of claim 1, wherein a piezoelectric axis of said zinc oxide layer forms an angle in the range of 80° to 90° with respect to said main surface of said silicon substrate.

6. The surface acoustic wave device of claim 1, wherein the thickness h of said zinc oxide layer with respect to a wavelength $\lambda$ of a surface acoustic wave is selected so that $0.9 < 2\pi h/\lambda < 3.5$.

7. The surface acoustic wave device of claim 1, wherein said dielectric layer is made of silicon dioxide.

8. A surface acoustic wave device, comprising a silicon substrate having a main surface with a predetermined crystalline orientation; a first layer provided on said main surface of said silicon substrate and a second layer provided on said first layer, one of said first and second layers being a dielectric and the other of said first and second layers including a layer of zinc oxide; and plural electrodes provided on said layer of zinc oxide, electrical excitation of said electrodes causing a surface acoustic wave to propagate along a predetermined crystalline axis of said silicon substrate; wherein said first layer includes said layer of zinc oxide; wherein said second layer is said dielectric; and wherein said first layer also includes a layer of metal disposed between said zinc oxide layer and said silicon substrate.

* * * * *